(12) United States Patent
Schemmann

(10) Patent No.: US 10,187,022 B2
(45) Date of Patent: Jan. 22, 2019

(54) RF CLASS AB CASCODE AMPLIFIER WITH LINEARIZATION AND STEERING DIODES

(71) Applicant: ARRIS Enterprises LLC, Suwanee, GA (US)

(72) Inventor: Marcel F. Schemmann, Maria Hoop (NL)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/591,051

(22) Filed: May 9, 2017

(65) Prior Publication Data

US 2017/0324386 A1  Nov. 9, 2017

Related U.S. Application Data

(60) Provisional application No. 62/333,401, filed on May 9, 2016.

(51) Int. Cl.

| H03F 3/20 | (2006.01) |
|---|---|
| H03F 1/30 | (2006.01) |
| H03F 1/32 | (2006.01) |
| H03F 1/08 | (2006.01) |
| H03F 3/26 | (2006.01) |
| H03F 3/45 | (2006.01) |
| H03F 3/30 | (2006.01) |

(52) U.S. Cl.
CPC ............... *H03F 3/20* (2013.01); *H03F 1/086* (2013.01); *H03F 1/305* (2013.01); *H03F 1/307* (2013.01); *H03F 1/32* (2013.01); *H03F 1/3241* (2013.01); *H03F 3/26* (2013.01); *H03F 3/45973* (2013.01); *H03F 1/3217* (2013.01); *H03F 3/3076* (2013.01)

(58) Field of Classification Search
CPC .......... H03F 1/086; H03F 1/305; H03F 1/307; H03F 1/32; H03F 1/3241; H03F 3/26; H03F 3/45973; H03F 3/30; H03F 3/3001; H03F 3/3022; H03F 3/45; H03F 3/45183; H03F 3/45192; H03F 2203/30
USPC ....................................... 330/262, 263, 267
See application file for complete search history.

(56) References Cited

U.S. PATENT DOCUMENTS

| 3,046,413 | A | * | 7/1962 | Clapper | H03K 3/288 |
|---|---|---|---|---|---|
| | | | | | 327/126 |
| 3,187,200 | A | * | 6/1965 | Gardner | H03K 3/012 |
| | | | | | 327/199 |
| 5,652,545 | A | * | 7/1997 | Miyashita | H03F 1/08 |
| | | | | | 330/253 |
| 6,185,057 | B1 | | 2/2001 | Masenas | |
| 6,489,845 | B1 | | 12/2002 | Maschhoff | |
| 8,724,355 | B1 | | 5/2014 | Pinkhasov et al. | |

(Continued)

FOREIGN PATENT DOCUMENTS

GB  1382695 A  2/1975

OTHER PUBLICATIONS

PCT Search Report and Written Opinion, PCT/US2017/031834, dated Oct. 5, 2017.

*Primary Examiner* — Khanh V Nguyen
(74) *Attorney, Agent, or Firm* — Lori Anne D. Swanson

(57) ABSTRACT

Systems and methods for amplifying signals. In some embodiments, the signals may be amplified using a diode steering network with an amplifier operated in class AB mode. In some embodiments, distortion in the amplified signal may be corrected using a feed forward cancellation circuit operated in class A mode.

7 Claims, 23 Drawing Sheets

(56) References Cited

U.S. PATENT DOCUMENTS

2004/0000949 A1 1/2004 Tsuchi
2012/0169422 A1* 7/2012 Fiocchi .................. G05F 3/262
330/257

* cited by examiner

RF CLASS AB CASCODE AMPLIFIER WITH LINEARIZATION AND STEERING DIODES

CROSS REFERENCE TO RELATED APPLICATIONS

This application claims benefit under 35 USC § 119 to U.S. Provisional Application No. 62/333,401 filed on May 9, 2016.

BACKGROUND

The subject matter of this application relates to amplifiers capable of being used in CATV transmission networks.

Linear RF amplifiers are often designed as class A amplifiers, which are one of the most commonly used amplifiers because of their excellent linearity. In a class A amplifier, the transistor is always biased "ON" so that it conducts during one complete cycle of the input signal waveform, producing minimum distortion and maximum amplitude to the output since there is no crossover distortion to the output waveform, even during the negative half of the cycle. However, because the transistor is always biased "ON," one of the main disadvantages of class A amplifiers is that their efficiency is very low as the constant and usually large currents cause a considerable amount of power to be lost.

This is particularly true in CATV transmission networks. When operated with a broadband signal containing many RF channels, the voltage bias point of the amplifier must typically be around 5 times the rms output voltage of the output stage when the probability of clipping must be in the ppm range. This is necessary in order to ensure that the amplifier can support peak output voltages. Such low clip probabilities are typical in CATV systems that support QAM channels with high complexity such as QAM256. The bias current of the amplifier similarly must be around 5 times the rms signal current in the amplifier output stage. As a result the power efficiency that can be attained is very low, on the order of 4% and often less.

A class B amplifier, conversely, has a pair of transistors that each conduct alternatingly only for one half cycle of the input signal. Since the active devices are switched off for half the input cycle, the active device dissipates less power and hence the efficiency is improved. However, since each active device truncates half the input signal and the output signal is the sum of the outputs of the active devices cross-over distortion that occurs when one device switches off and the other switches on is high in Class B amplifiers.

Class AB amplifiers, which are widely used in audio systems, use a bias current set at a non-zero value with a magnitude much lower than the peak output current, resulting in improved power efficiency relative to class A amplifiers. The output is configured with a transistor pair such that one transistor pulls positive voltages high and a second transistor can push negative voltages low. For small voltage magnitudes, both transistors are active but for large voltage magnitudes (either positive or negative) only one transistor is active whereas the current on the other output transistor can reach zero or is often held at a low minimum value. While some signal distortion is induced due to the transition in operation where either or both transistors are active, such distortions can be minimized by designing strong negative feedback into the amplifier; a fraction of the output signal is compared to the input signal and a correction signal is provided with high gain to the output signal if the output signal fraction deviates from the input signal. As a result, the output signal is held close to a multiple of the input signal and distortions are low.

In RF amplifiers in a push-pull configuration, typically an output transformer is used where both transistors can for instance be N-type FETs, and both can be driven with a signal set relative to ground, as opposed to some floating node. The output transformer has a differential input such that the difference of the transistor output is presented at the transformer output. Feedback in an RF amplifier is generally limited, due to the high signal bandwidth that needs to be amplified. Too much delay in the feedback path combined with a high gain for the correction signal will lead to amplifier oscillation due to the inevitable signal delay or phase shift in the feedback path. This complicates the implementation of a class AB amplifier, which produces distortions due to the transitions in the operating mode of the output transistors. Second, turning an RF transistor off can produce very high distortions when the transistor needs to be turned on again, it is preferable to prevent a complete turn-off under all conditions and instead ensure a minimum controlled current. Whereas ensuring a minimum current is not difficult when using a floating (output) node where the two transistors are connected it is less trivial in the RF amplifier where transistors are referenced to ground; use of the floating output node would be very difficult due to parasitic capacitance of that node to ground. This is very significant at the high output frequencies produced by an RF amplifier.

In RF amplifiers an alternate method to reduce distortion using feedback is feed-forward distortion compensation. When using feed-forward distortion compensation, the output of a first RF amplifier is provided to an RF coupler. A fraction of the output signal is coupled out and that fraction is compared to the input signal. The difference, due to distortion, is provided to a second, smaller amplifier with the same gain as the first amplifier and added to the output of the first amplifier such that the distortion in the combined signal is cancelled. Because the distortion power is typically much lower than signal power, the power handling capability of the second amplifier that only handles distortion may be much lower than that of the first RF amplifier. However, such a design suffers from complexity; it requires two extra couplers, an extra amplifiers and fine tuning of the gain and phase delay of the signal paths to ensure consistent distortion cancellation. Nevertheless results can be good such as 20 dB of distortion cancellation. A second disadvantage of the use of couplers is the inevitable loss of RF couplers; a fraction of the output power of the amplifier is dissipated in the output couplers.

What is desired, therefore, is an improved amplifier suitable for use in CATV networks such that high power efficiency can be achieved with linearity.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

As previously indicated, in a class B amplifier with a push-pull output configuration, one transistor amplifies positive half-waves and a second transistor amplifies negative half-waves. In one implementation, a signal could be provided in differential form to two output transistors, each transistor biased such that the current is zero for no input and one transistor conducts for positive input and the second transistor conducts for negative input. As a consequence the transistors will go through a full turn-off and possibly negative bias at gate or base and significant undesirable transients result when the transistor is cycling off or on, especially for processes dominated by minority carrier transport due to potentially long minority carrier lifetimes. Preferably a pre-processing circuit is used to generate signal half-waves, one for positive half waves and one for negative half waves that does not rely on minority carrier transport in semiconductor devices, and the associated long lifetimes. For this reason, a preferred implementation uses Schottky diodes to rectify a signal and also to maintain a controlled impedance into the rectifier.

Figure 1:
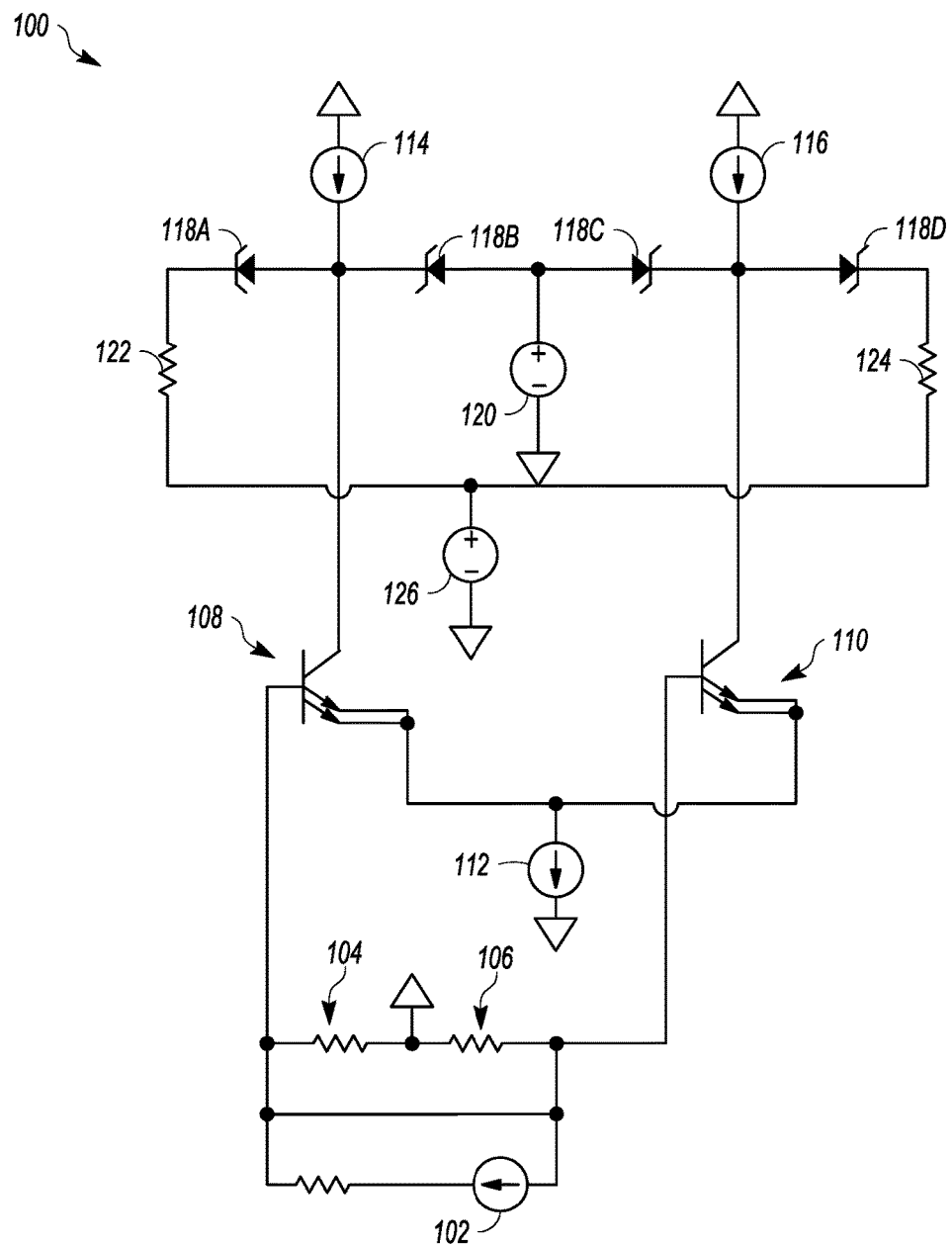
FIG. 1 shows an exemplary amplifier circuit using steering diodes.
Figure 2:
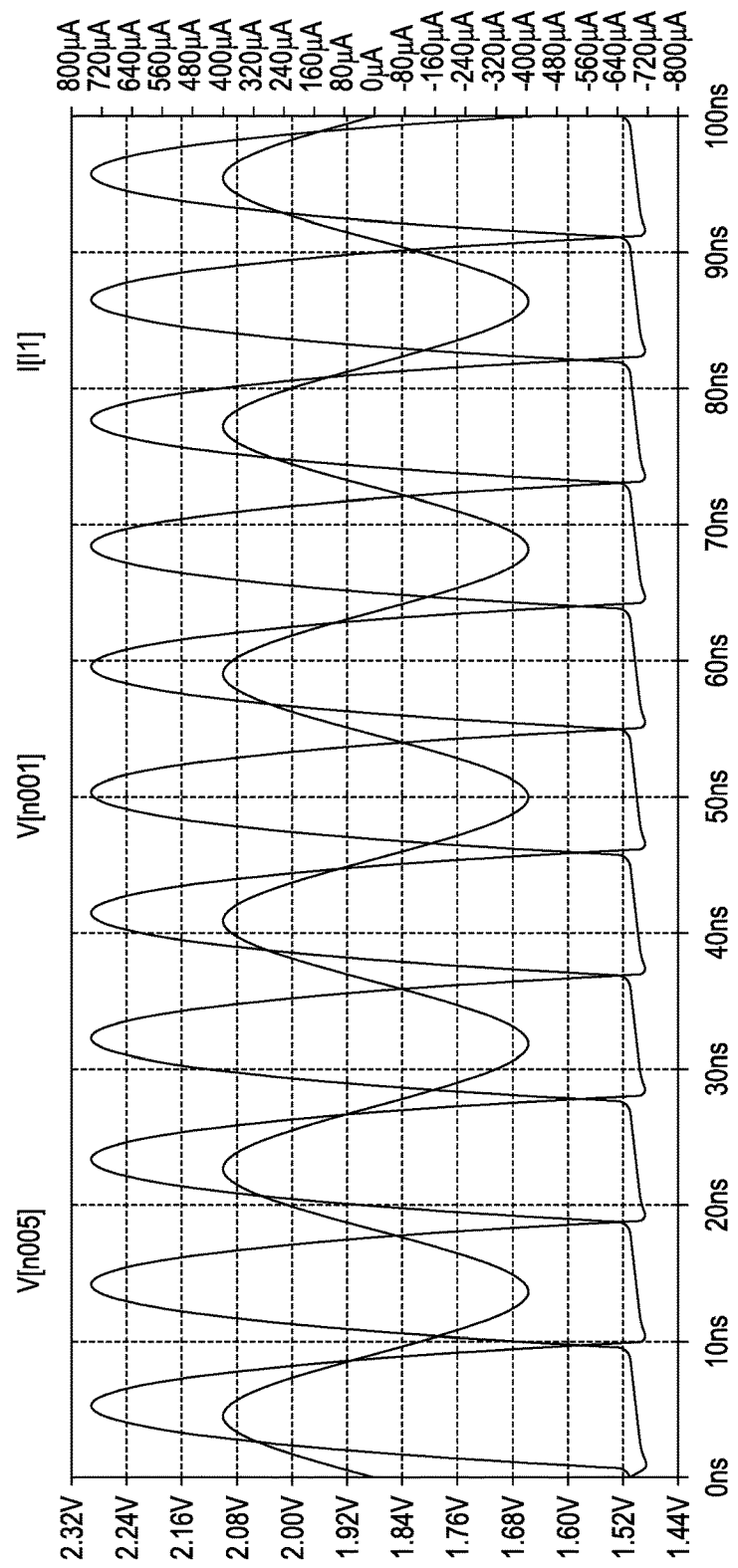
FIG. 2 shows a simulated output voltage of the amplifier circuit of FIG. 1.

Referring to FIG. 1, an exemplary amplifier circuit 100 may include an input signal generator 102 terminated with resistors 104 and 106 driving a push-pull amplifier with transistors 108 and 110. The transistors 108 and 110 are arranged in a differential pair with current source 112 setting the total current and current sources 114 and 116 setting the current to the collectors of 108 and 110, respectively, and a rectifier diode network 118a, 118b, 118c, and 118d. The diodes 118c and 118d are biased with a voltage source 120, the diodes 118a and 118d are terminated in resistors 122 and 124 that are biased with voltage source 126. The voltage difference between voltage source 120 and voltage source 126 is set such that a small current flows in the diodes 118a to 118d when the input signal to the amplifier is zero. If the input to transistor 108 swings positive, the current in transistor 108 increases, pulling the node 118b/118c low such that the current in diode 118b increases and the current in diode 118a falls essentially to zero. At the same time the current in transistor 110 decreases such that the excess current from current source 116 is put out at diode 118d and the current in diode 118c essentially falls to zero. Thus positive half-waves are output at resistor 124; similarly negative half waves are output at resistor 122, which is illustrated in FIG. 2. It is understood that current sources and voltage sources in an integrated circuit can be realized with different arrangements of transistors and other components, and in some embodiments RC or LC filters may be used.

Figure 3:
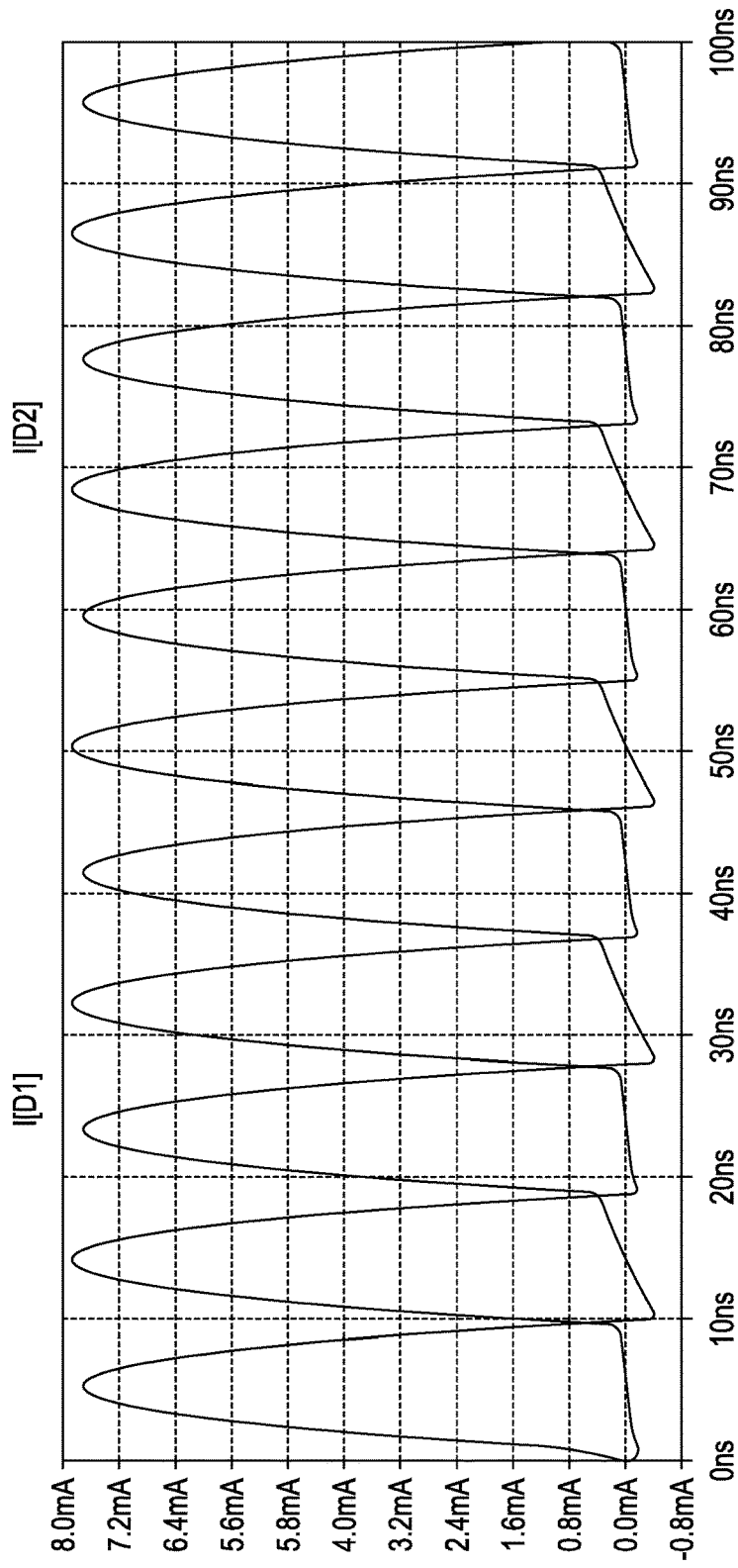
FIG. 3 shows a simulated output current of the amplifier circuit of FIG. 1.

FIG. 3 shows that the diodes 118b conducts current when the diode 118a is off, and conversely the diode 188c conducts current when the diode 118d is off. The cross-over between currents in diodes 118a and 118b (and 118c and 118d) can be controlled with the voltage difference across voltage sources 120 and 126, respectively, and the current though current sources 114 and 116, respectively. In the exemplary amplifier circuit 100 shown in FIG. 1, the difference between outputs at resistors 122 and 124 corresponds to the input signal. The Schottky diodes are majority carrier transport devices that can turn on and off with minimal transients; simulations were performed with relatively large discrete devices and as shown in FIG. 3, some deviations from a perfectly rectified signal can still be found. In an integrated circuit or on the bare die level, better performance can be obtained; however, it is not necessary that the diode network 118a-118d output perfectly rectified half waves of the signal.

Figure 4:
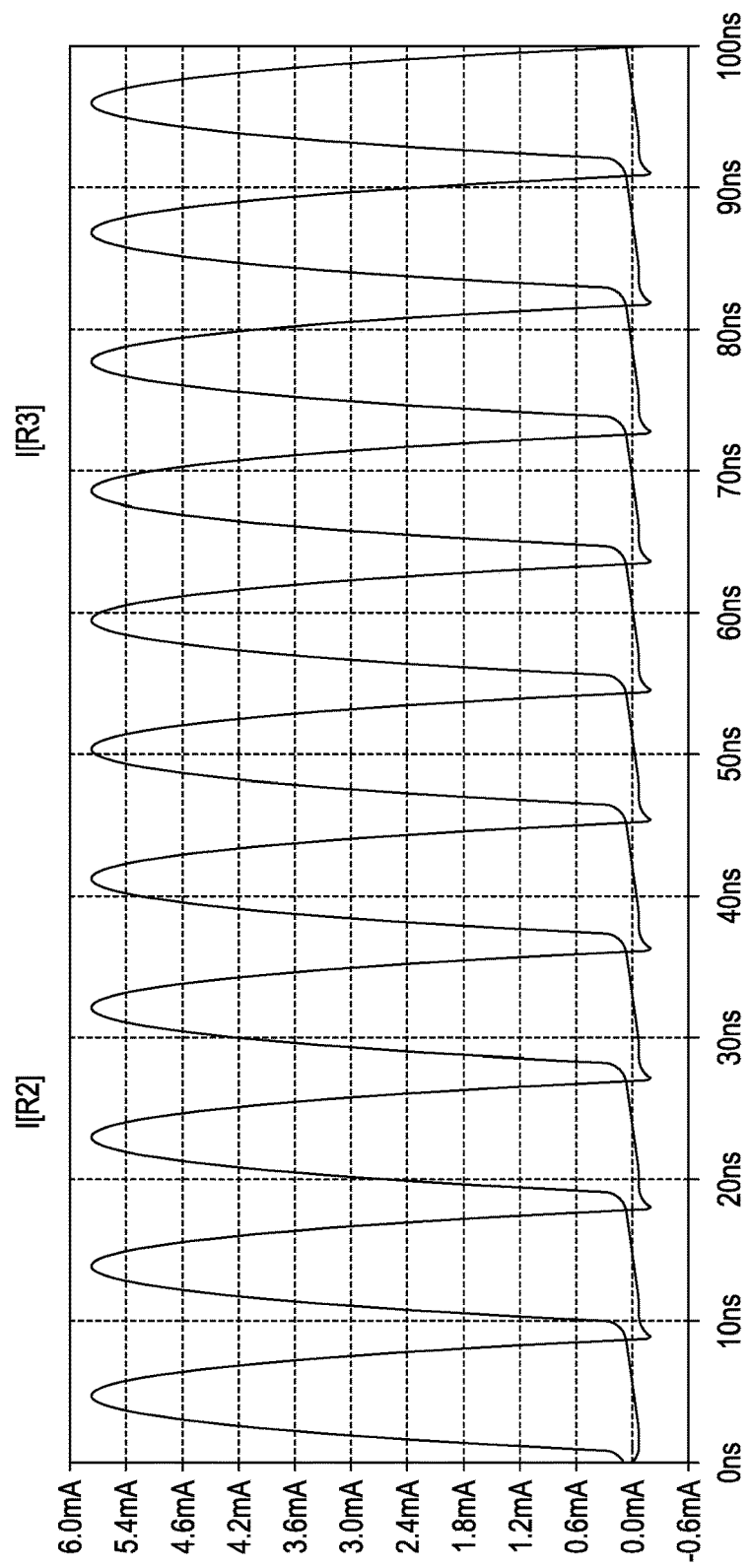
FIGS. 4-6 show various waveforms resulting from an imbalance between current provided to the collectors of the transistors of FIG. 1 and the output current of the transistors.
Figure 5:
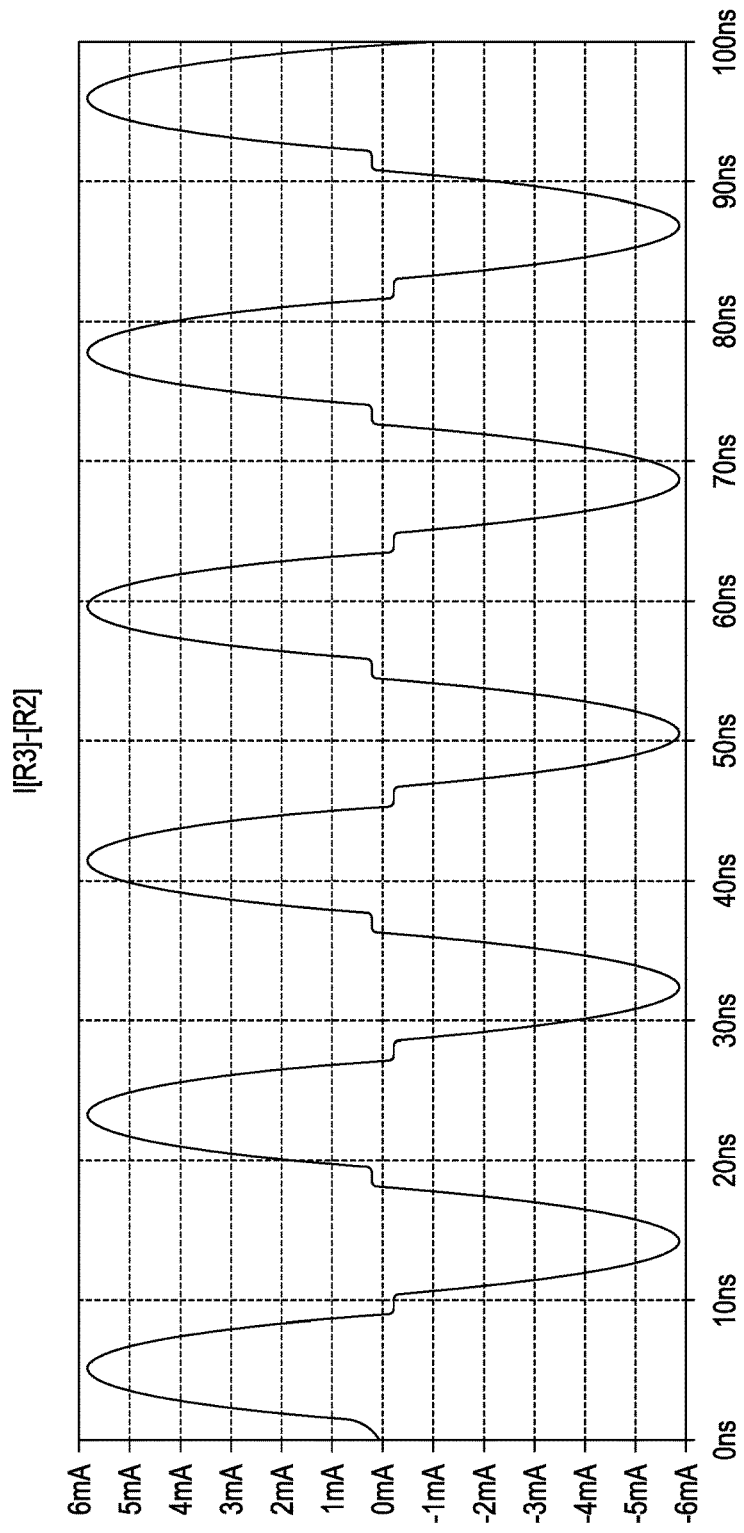
Figure 6:
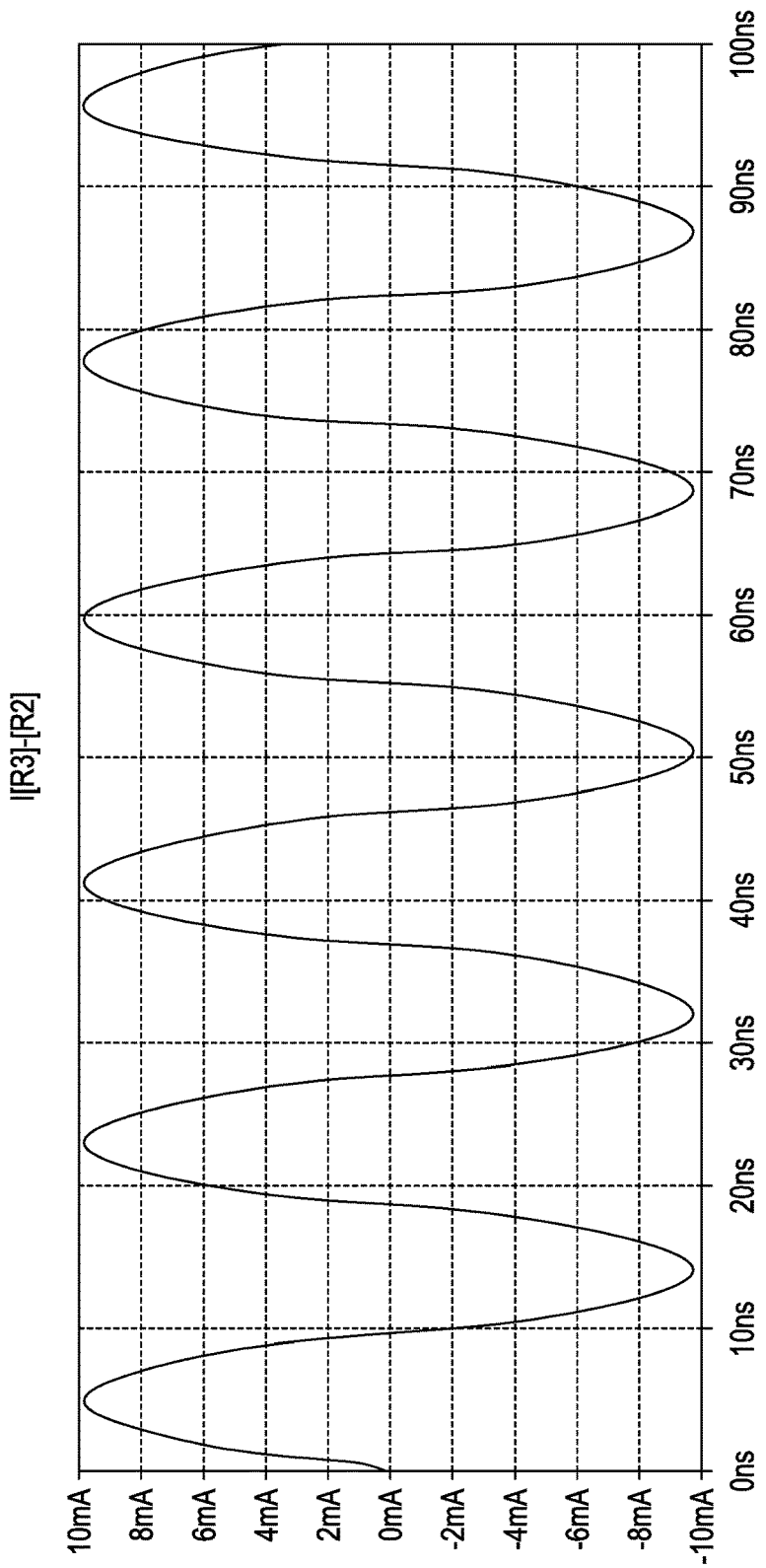
Figure 7:
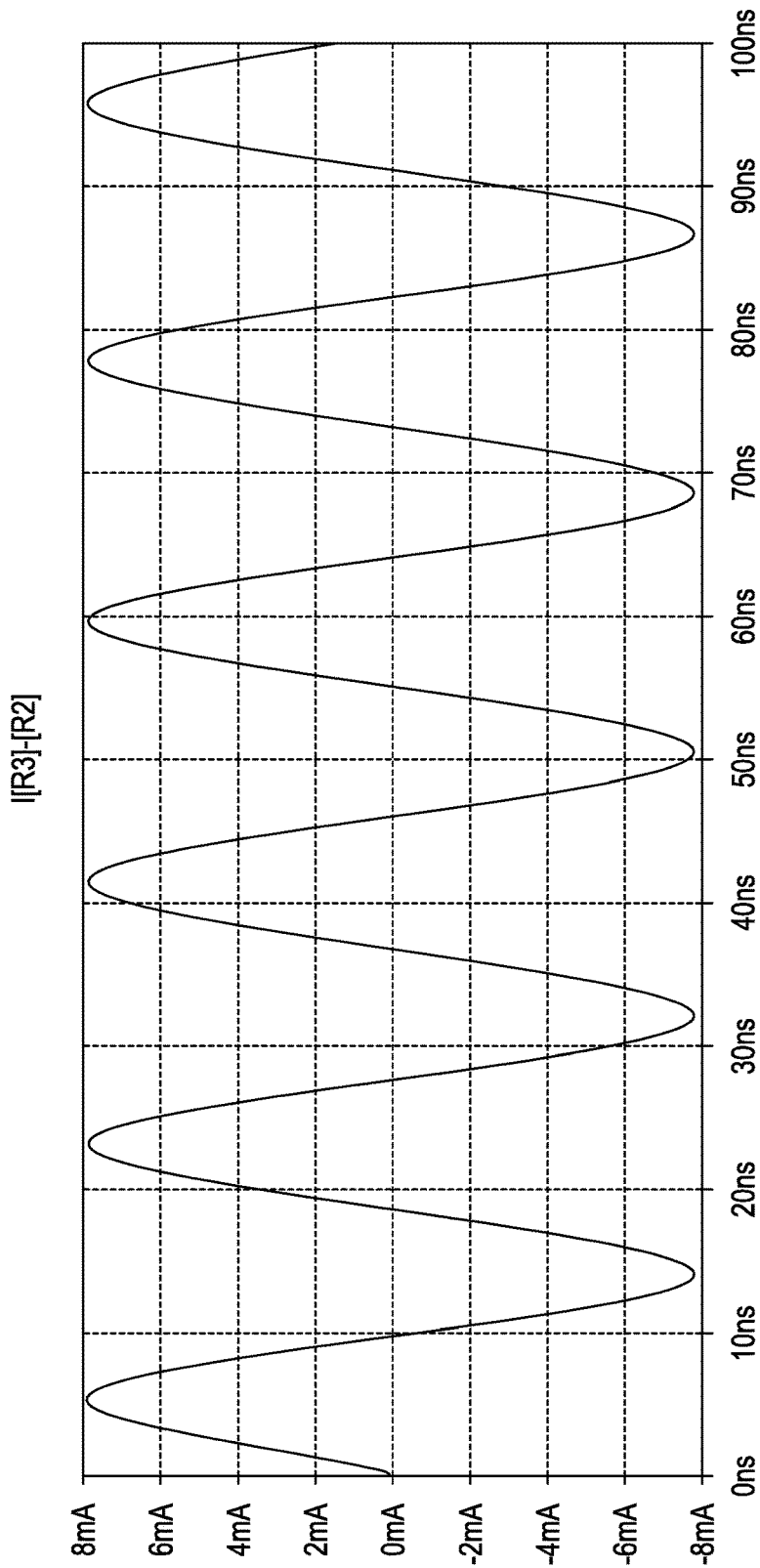
FIG. 7 shows a waveform that results when the current provided to the collectors of the transistors of FIG. 1 is balanced with the output current of the transistors.

For instance, if current sources 114 and 116 provide insufficient current relative to current source 112, then diodes 118b and 118c will provide the missing current and conduct a larger fraction of the half wave than do diodes 118a and 118d. This is illustrated in FIG. 4 where part of the half-waves at resistors 122 and 124 are missing (the gaps between the half-waves). The difference between the outputs at resistors 122 and 124 is eventually provided to the output stage, which will exhibit "crossover distortion" as illustrated in FIG. 5 showing a 10% mismatch, and the amplifier will lack gain for small signals. Conversely, with too much bias provided by current sources 114 and 116 relative to source 112 as shown in FIG. 6, again at a 10% mismatch, the crossover distortion causes too much gain in the low signal region. Where the bias provided by current sources 114 and 116 match that provided by current source 112, the output (constructed as the difference between the two half-wave outputs) is a perfect full-wave signal as shown in FIG. 7.

As one of ordinary skill in the art will appreciate from the foregoing disclosure, the bias control of the half wave rectifier implemented by the rectifier diode network 118a-118d permits control of the cross-over distortion typical for class AB amplifiers, from insufficient gain at low signal amplitude, to correct gain, to excess gain. As will be explained later in this specification, this benefit is obtained independently of the minimum bias setting of the output transistors in the amplifier.

Whereas different amplifier topologies may be used with the rectifier diode network 118a-118d in order to obtain amplifier half waves in the output transistors of a push-pull stage, this specification will subsequently illustrate the disclosure herein using a cascode output stage. A cascode output stage is also particularly suitable for the added integration of a feed-forward distortion compensation circuit, that circuit in itself being particularly suited to also include a feedback signal for further reduction in distortion.

Figure 8:
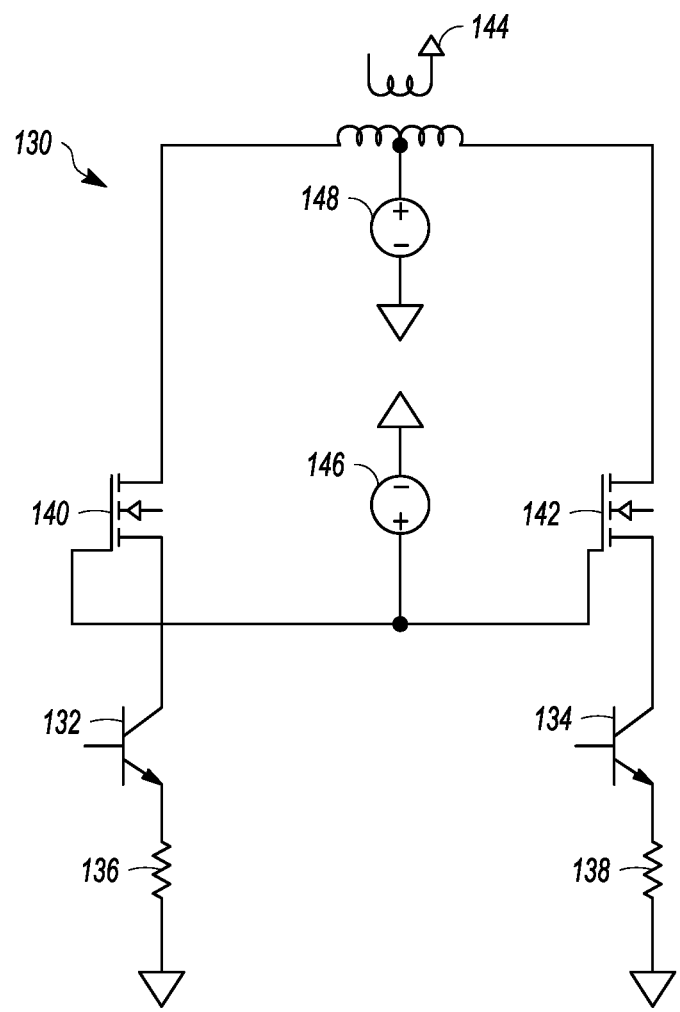
FIG. 8 shows and exemplary cascode output stage for the amplifier of FIG. 1.

Referring specifically to FIG. 8, a cascode push-pull output stage 130 may preferably include transistors 132 and 134 that receive a drive signal, for example signals from resistors 122 and 124 of FIG. 1, optionally amplified and optionally having a bias offset to set the operating point of transistors 132 and 134. Optionally transistors 132 and 134 may have emitter feedback resistors 136 and 138 to improve linearity. The collectors of transistors 132 and 134 are connected to the source of output FETs 140 and 142, which can be of different types such as GaN output transistors. Since the collectors of transistors 132 and 134 are good current sources, the current in FETs 140 and 142 is nearly the same as from transistors 132 and 134, respectively, but the drains of FETs 140 and 142 are connected to output transformer 144 where the voltage swing is high. In contrast, the voltage swing at transistors 132 and 134 is low, and can be implemented with low voltage devices. The FETs 140 and 142 have a bias voltage from source 146 provided to the gate to set their operating point. The output transformer 144 is wired such that the supply voltage from source 148 is provided to the drains of FETs 140 and 142, and the difference between the currents in FET 140 and FET 142 is provided as the output. Thus, where transistors 132 and 134 are driven with rectified half-waves, then the output will be the difference of those rectified half-waves such that the original input wave is reconstructed.

The diode rectifier network 118a-118d shown in FIG. 1 will generally not be perfect; even though bias may be controlled fairly well and diodes may be fast and of low parasitic capacitance, some cross-over distortion may still occur. For this reason it is preferable to monitor the signals going to the output transistors and correct distortions before they are output by the FETs 140 and 142.

Figure 9:
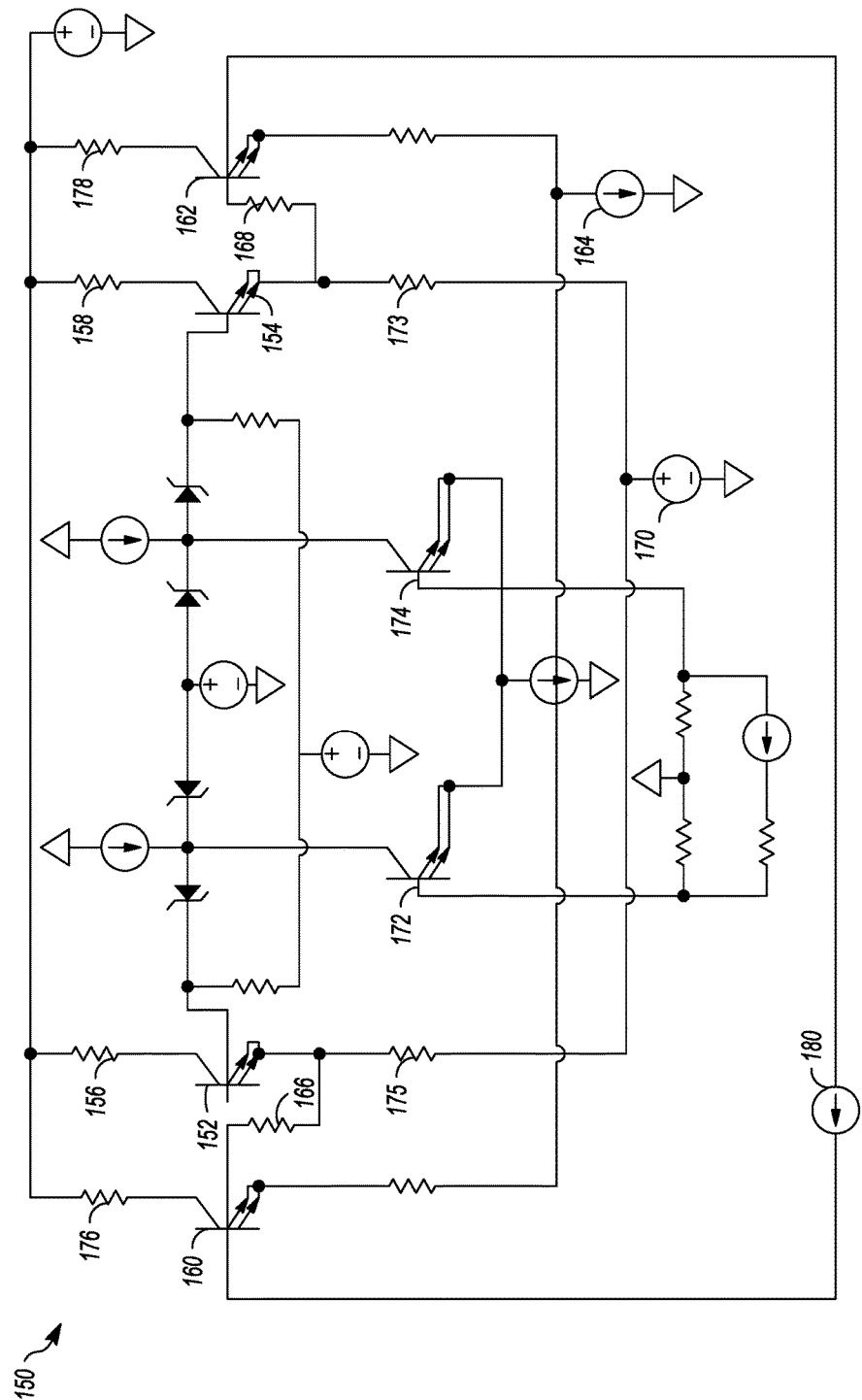
FIG. 9 shows an exemplary class AB amplifier with feed-forward distortion compensation.
Figure 10:
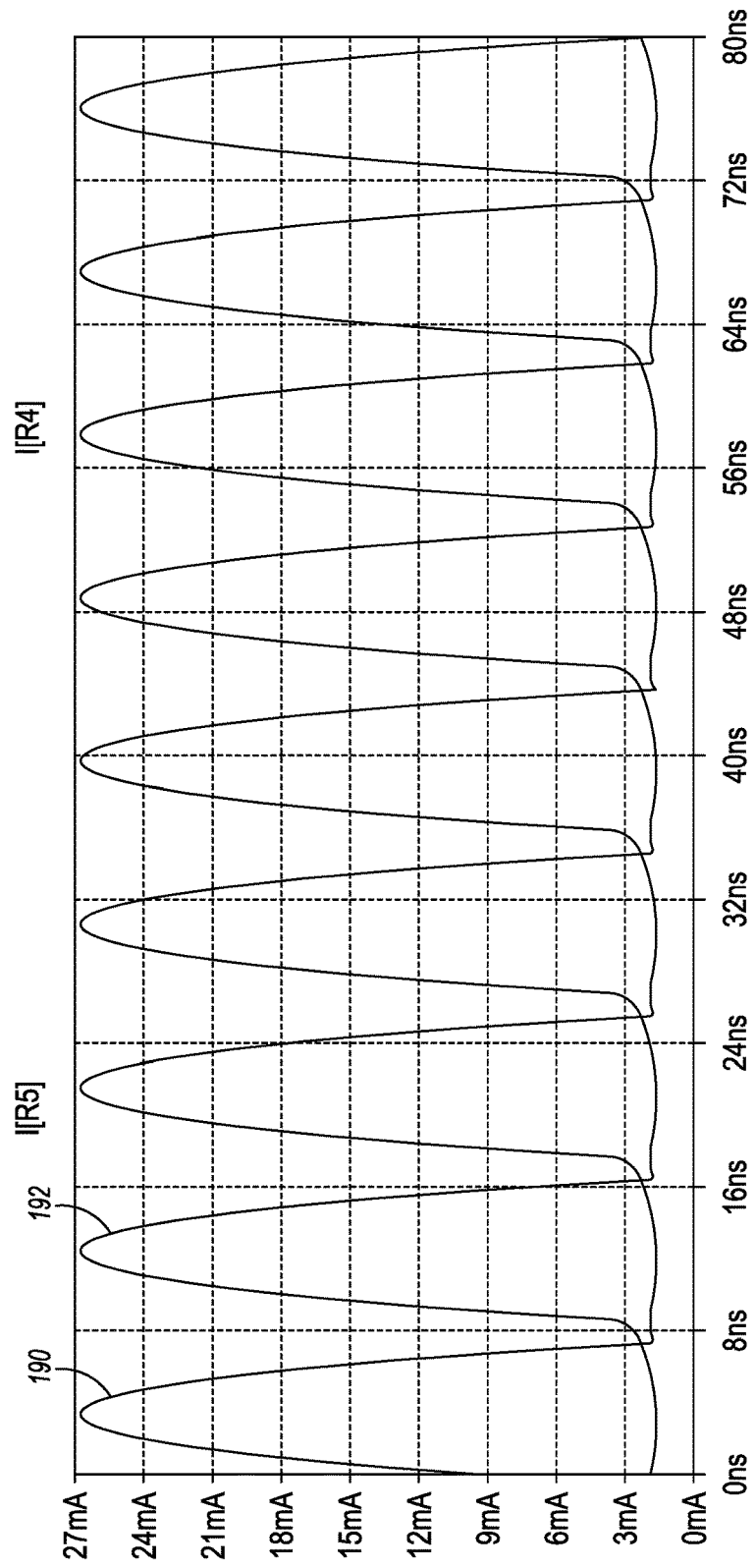
FIG. 10 shows the half-wave currents generated by the amplifier of FIG. 9.

Referring specifically to FIG. 9, for example, an exemplary class AB amplifier 150 with feed-forward distortion compensation may generally be constructed based on the circuits shown in FIGS. 1 and 8. Transistors 152 and 154 correspond to transistors 132 and 134 in FIG. 8. Resistors 156 and 158 represent the low impedance output as seen when looking into the source of FETS 140 and 142 in FIG. 8. Added are transistors 160 and 162 that essentially reproduce the currents measured in the emitters of transistors 152 and 154; thus, these currents essentially correspond to the current provided to the output FETs 140 and 142 of FIG. 8. Those of ordinary skill in the art will appreciate that the transistors 152 and 154 may be FETs or any other appropriate transistor type. Those of ordinary skill in the art will also appreciate that as an alternate embodiment of the circuit 150 shown in FIG. 9, the base voltages of transistors 152 and 154 could be connected to resistors 166 and 168, respectively, to capture parasitic effects of transistors 152, 154, 160, and 162 in applications where that is desired. Voltage source 170 is used to set an operating point for transistors 152 and 154 such that the transistor currents do not reach zero, but instead reach a minimum desired operating point. Those of ordinary skill in the art will appreciate that that this occurs independently from the settings of the half-wave rectifiers around transistors 172 and 174; thus cross-over distortion can be minimized at the half wave rectifiers without having to compromise on the minimum current on transistors 152 and 154. This is shown in FIG. 10, which plots the current 190 in resistor 173 and the current 192 in resistor 175, respectively. Those of ordinary skill in the art will appreciate that voltage and current sources in FIG. 9 can be implemented with various bias networks.

Figure 11:
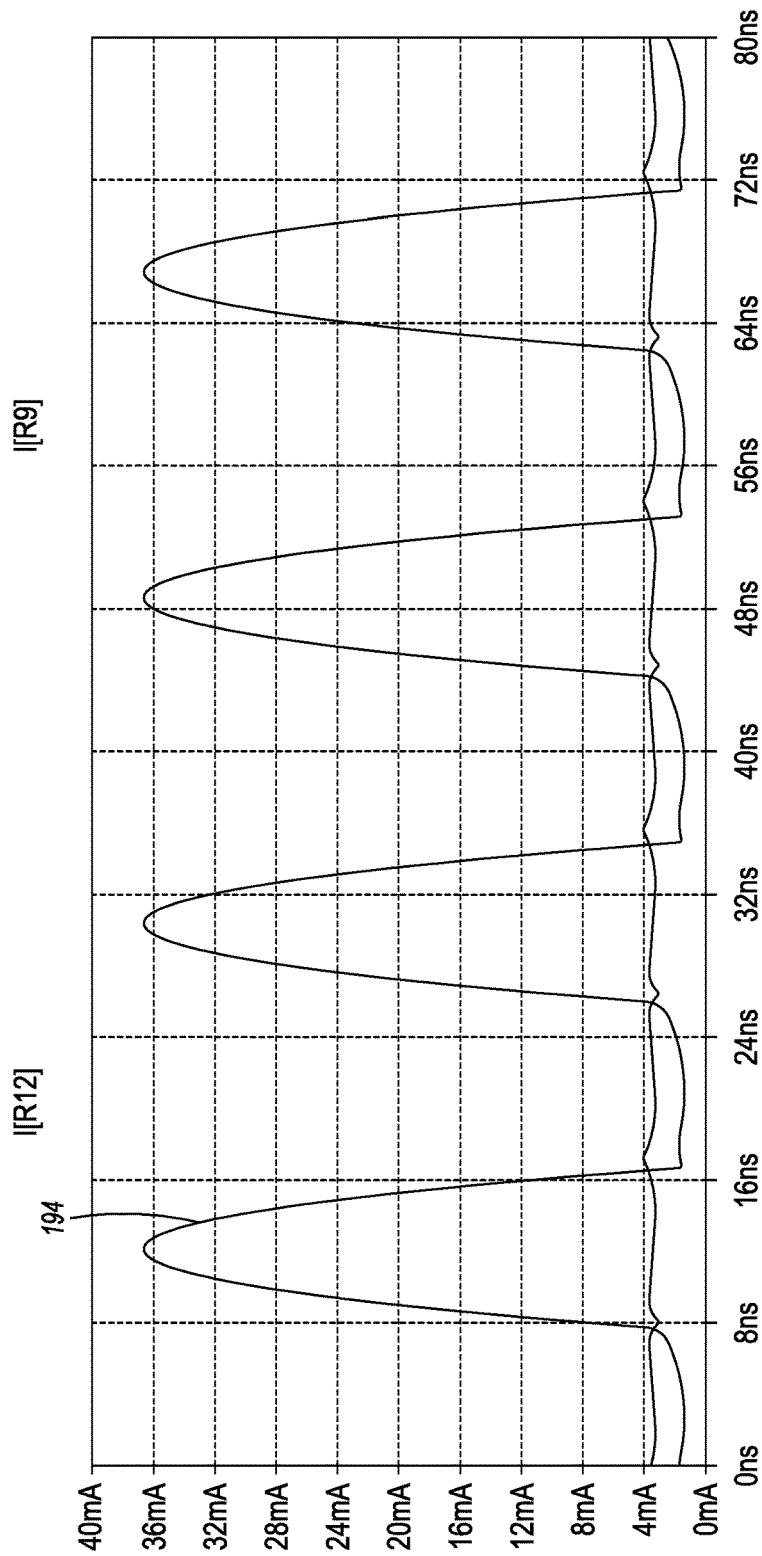
FIG. 11 shows an output signal and an error signal of the amplifier of FIG. 9.

Transistors 160 and 162 are biased with current source 164 and thus they operate as a difference amplifier. The current in resistors 173, 175, 176, and 178 thus represents the difference between the currents in transistors 152 and 154 that should ideally be an "amplified copy" of the input signal. However transistors 160 and 162 also obtain an additional input signal from current source 180, which is a copy of the input signal, appropriately scaled within an integrated circuit (or discrete circuit) such that the input signal is cancelled at transistors 160 and 162, and only the deviation of the "amplified copy" from a perfectly amplified input signal (the "error") is present in resistors 173, 175, 176, and 178. This is illustrated in FIG. 11 which shows the output signal 194 on resistor 156 and the error signal 196 on resistor 176 of the amplifier 150 shown in FIG. 9. The signals on resistors 158 and 178 look similar but for the other half wave.

Figure 12:
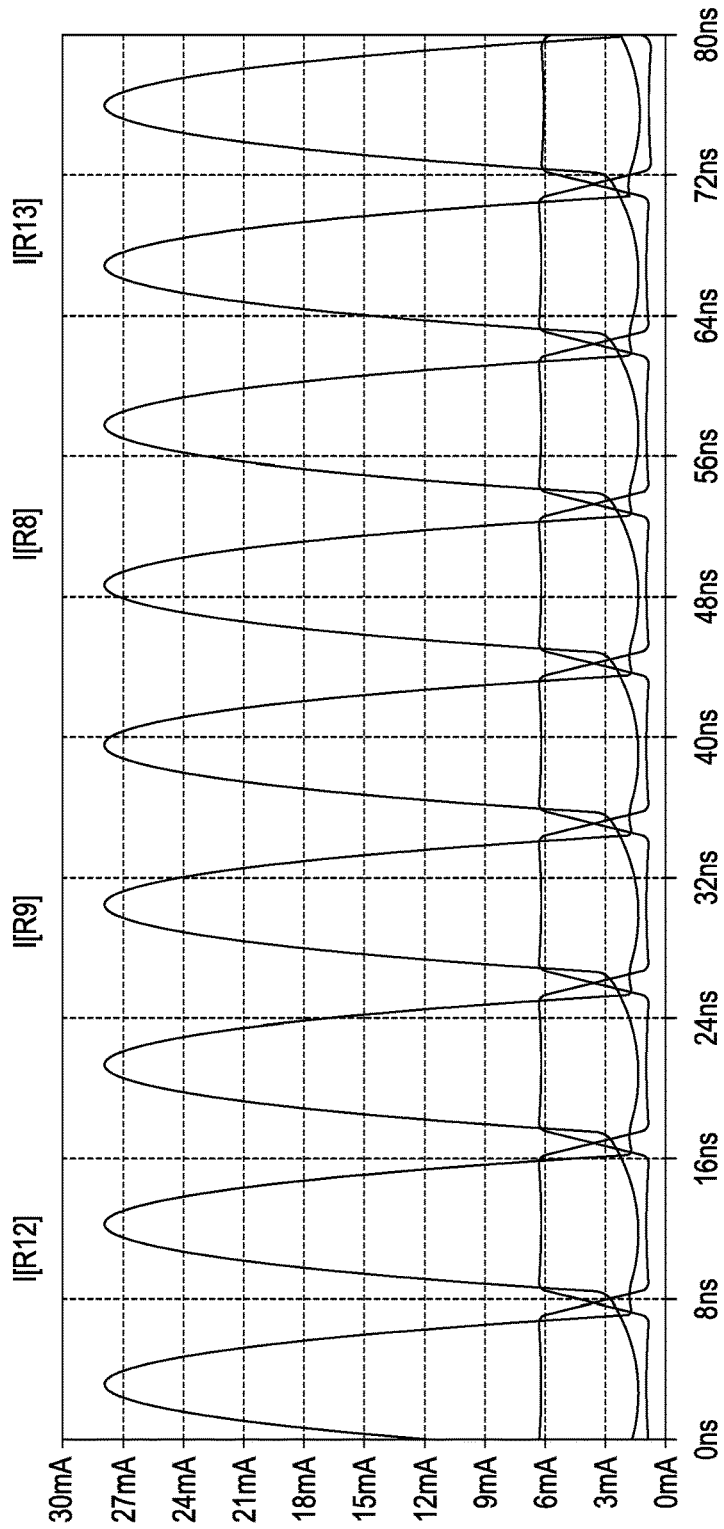
FIGS. 12 and 13 show crossover distortion resulting from a mismatch in bias currents in the amplifier of FIG. 9.
Figure 13:
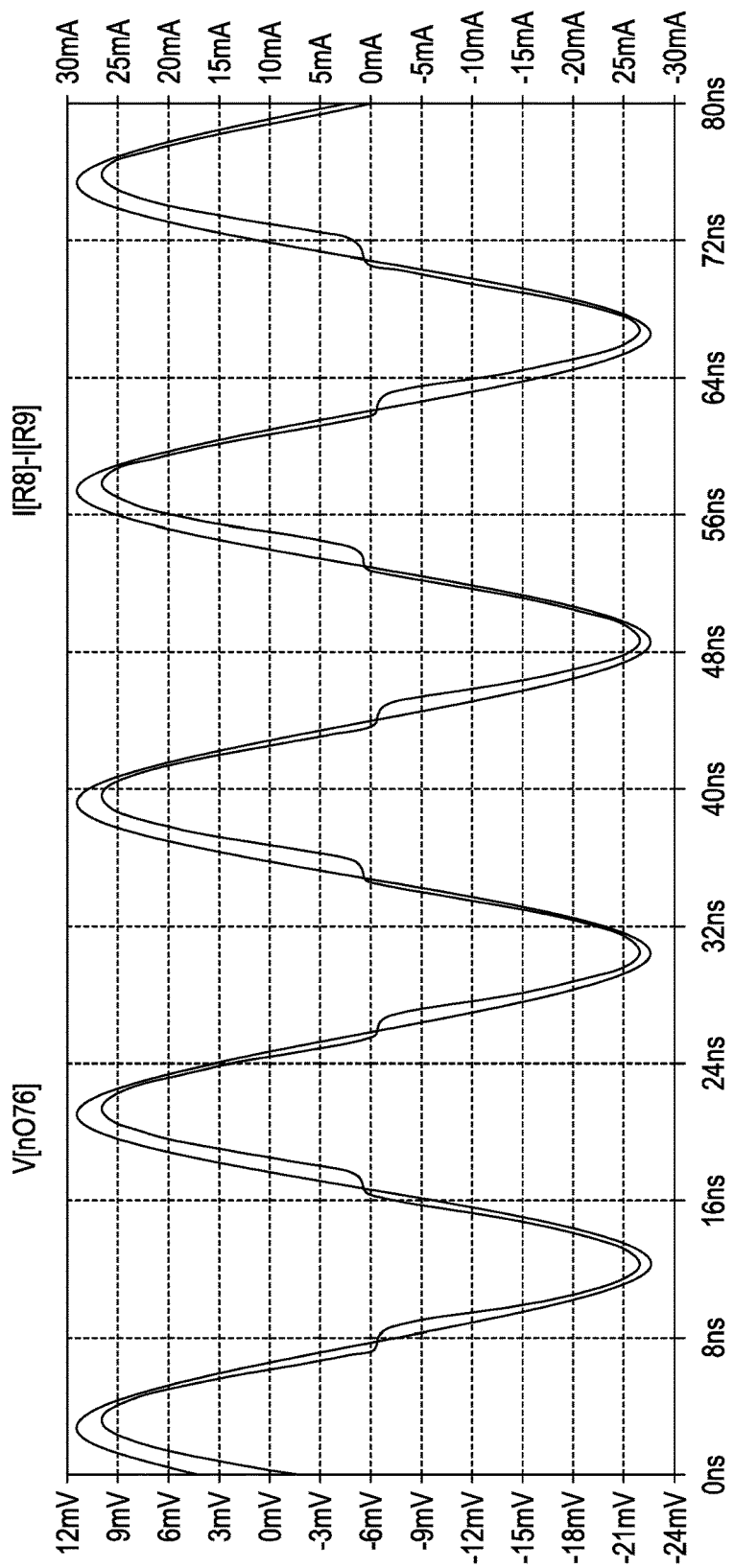

For a properly biased diode rectifier this error signal is relatively small. However assuming the same 10% mismatch as was illustrated in FIG. 6 with respect to the circuit of FIG. 1 to illustrate cross-over distortion, the error signal becomes significant as can be seen in FIG. 12 as the smaller block wave in resistors 176 and 178 with the main output half waves in resistors 156 and 158. The resulting output signal (the difference in currents in resistors 156 and 158 without this correction is shown in FIG. 13 where the crossover distortion is clearly visible. FIG. 13 shows the input signal (Vn016) together with the current difference in resistors 156 and 158.

Figure 14:
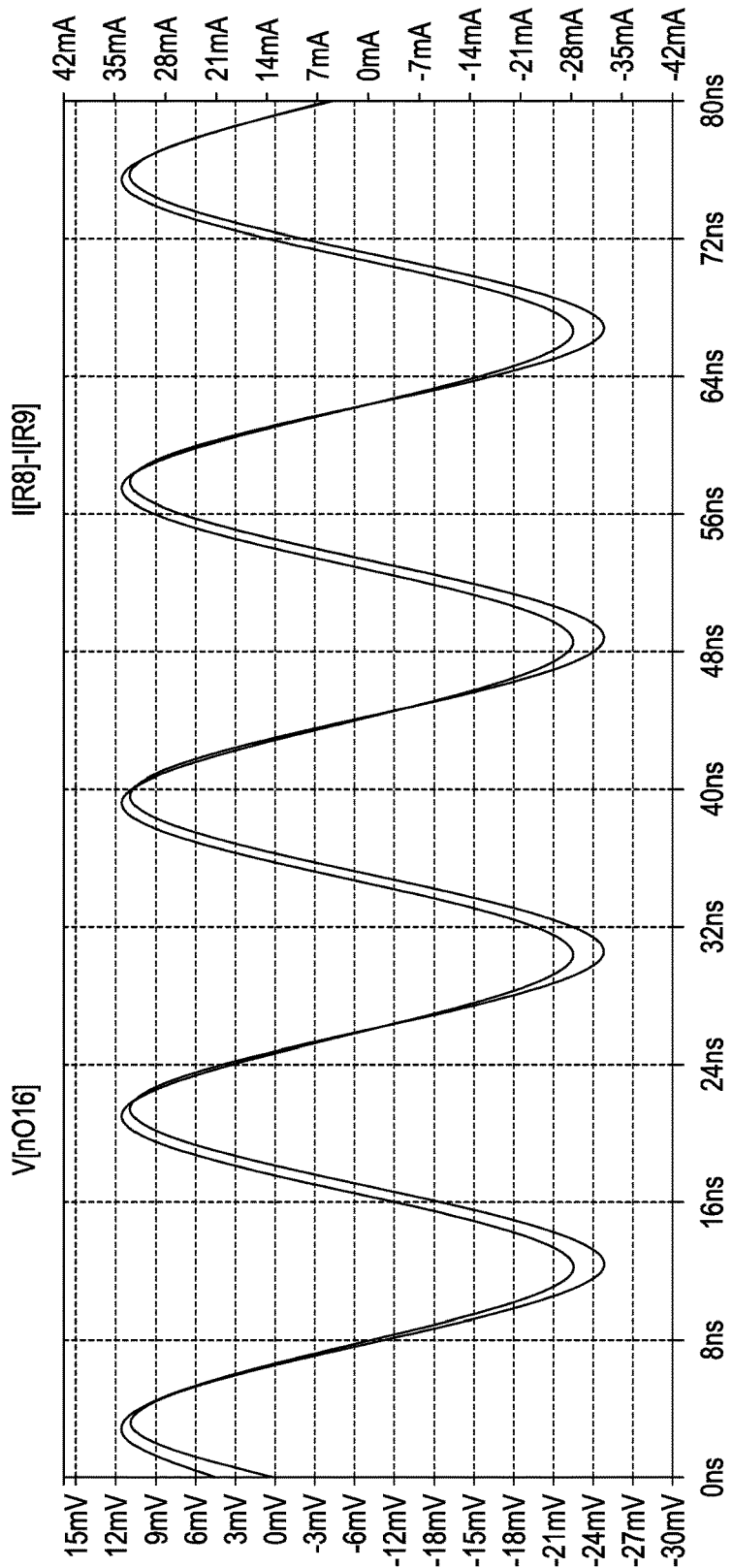
FIG. 14 shows the results of feed-forward correction on the amplifier of FIG. 9 with the mismatch illustrated in FIGS. 12 and 13.

With the feed-forward correction, the output signal is greatly improved as can be seen in FIG. 14 where the distortion is greatly reduced. The small phase shift between input and output signals, that is small due to the absence of transformer couplers in this electronic feed-forward implementation, results in only a small amount of delay that can easily be managed to obtain good distortion cancellation in the feed-forward path. As already indicated, in the cascode arrangement the driver transistors essentially act as a high impedance current source to low impedance outputs, hence within the cascode structure itself there is no need for impedance matching; instead, the cascode arrangement can be considered a lumped electronic design. This topology is particularly suitable for adding in other transistors acting as current sources such as 160 and 162 in FIG. 9 that add additional signals to the output, without needing magnetic couplers that would otherwise be needed in impedance matched RF designs. The use of such couplers not only causes a much greater phase delay, but also greatly increases losses and can introduce uncertainty in signal levels.

Also of note is that in FIG. 9, the emitters of driver transistors 152 and 154 may be used to monitor their current, but this is not required. The base signal of these transistors can also be used for current-monitoring purposes, as can any other signal representative of the diode rectifier output. Use of the emitters may have some added benefit in that, although they include distortions due to the non-linearity of the transistors 152 and 154, the feed-forward distortion may also compensate for such distortions.

As was shown in FIG. 10 the minimum current on transistors 152 and 154 is set above zero and, as discussed, can be done independently of the diode rectifier. Thus for no signal input, the amplifier output stage will still draw a minimum supply current and as such, it is not a pure class B amplifier, but is instead a class AB amplifier. Furthermore transistors 160 and 162 have a bias current, in the example shown in FIG. 11 just under 4 mA. When the error signal is large, the current in these transistors swings around that bias current, as shown in FIG. 12. The transistors 160 and 162 are operated in class A, and can correct error signals with peak levels up to their bias current. Thus, the proposed output stage is a cascode structure with one pair of driver transistors 152 and 154 supporting most of the current that is operated in class AB (near class B) and a second pair of "support" driver transistors 169 and 162 that is operated at low current in class A, where the collectors of the second pair of transistors cross with the collectors of the first pair of transistors. This means that transistors 160 and 154 connect to one FET in FIG. 8 such as FET 140 and transistors 162 and 152 connect to another FET such as FET 142.

The presence of a class A differential error correction stage in the cascode structure offers the possibility to add negative feedback to the amplifier design without the complication of class B operation. Either another pair of transistors similar to transistors 160 and 162 in FIG. 9 may be included, or feedback signals may be directed directly to transistors 160 and 162. The bias current on the transistors 160 and 162 only needs to be set high enough to compensate for error signals in the cascode structure, which is generally a small fraction of the peak output current of the amplifier.

In embodiments where feedback is also used for impedance matching, it can be preferable to provide negative feedback to the input of the amplifier because, for very poor output impedance matching, the error currents can be very large; if transistors 160 and 162 were used to compensate for such error currents, they might need a high bias current such that the power efficiency of the amplifier would be degraded.

Figure 15A:
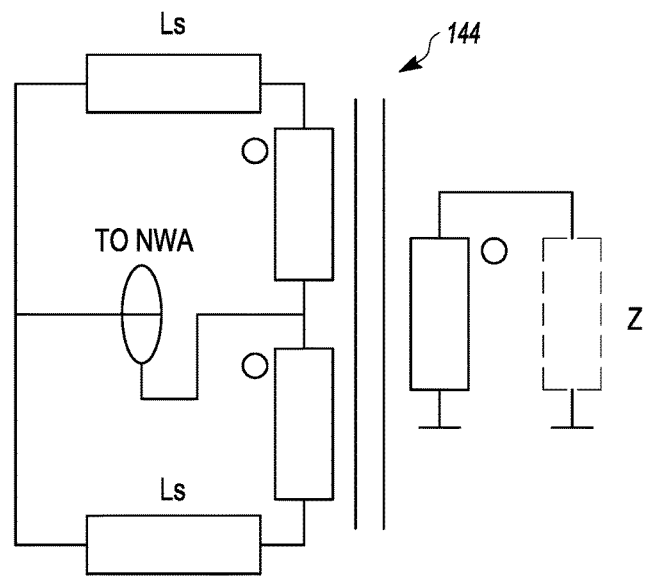
FIGS. 15A and 15B show a schematic illustration of a transformer used in a push-pull output stage, with added windings.

FIG. 15A schematically represents the output transformer 144 in FIG. 8 with an output load Z. The transformer is approximated with an ideal transformer with added stray inductance Ls at each connection to the transistors. Due to the winding configuration in an ideal transformer, a common mode current will be shorted to the center pin which would not cause any voltage across the transformer pins connected to the transistors. The voltage would be representative of only the differential voltage that is also presented at the output, and that voltage could effectively be used in a feed-back circuit. However, due to the stray inductance all currents to the transistors, including common mode current will induce a voltage such that measurement of the transistor output voltage and using that as feedback signal could cause signal distortions due to the common mode currents. This is not trivial because when one transistor is conducting then the differential and common mode currents are the same and therefore a distortion need not be induced. When both transistors are conducting differential and common mode currents differ and may affect the feedback differently.

Figure 15B:
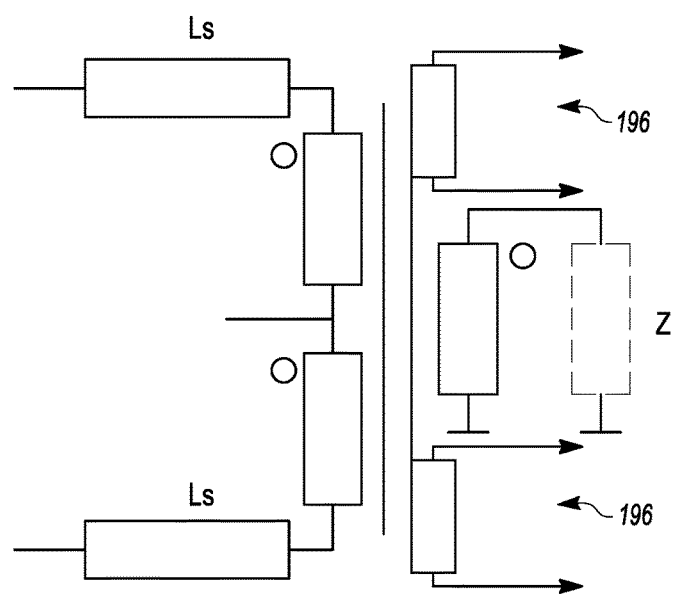

In order to overcome the problem of sensitivity to common mode current in the output transformer, the transformer may benefit from using one or more extra windings 196 used only for generating a feedback signal, as shown in FIG. 15B. The windings 196 are schematically indicated in blue and they only generate a feedback signal. In some embodiments, they may be wound bifilar with any of the other windings of the transformer in case that helps to improve performance. There may be one or more such windings.

Figure 16:
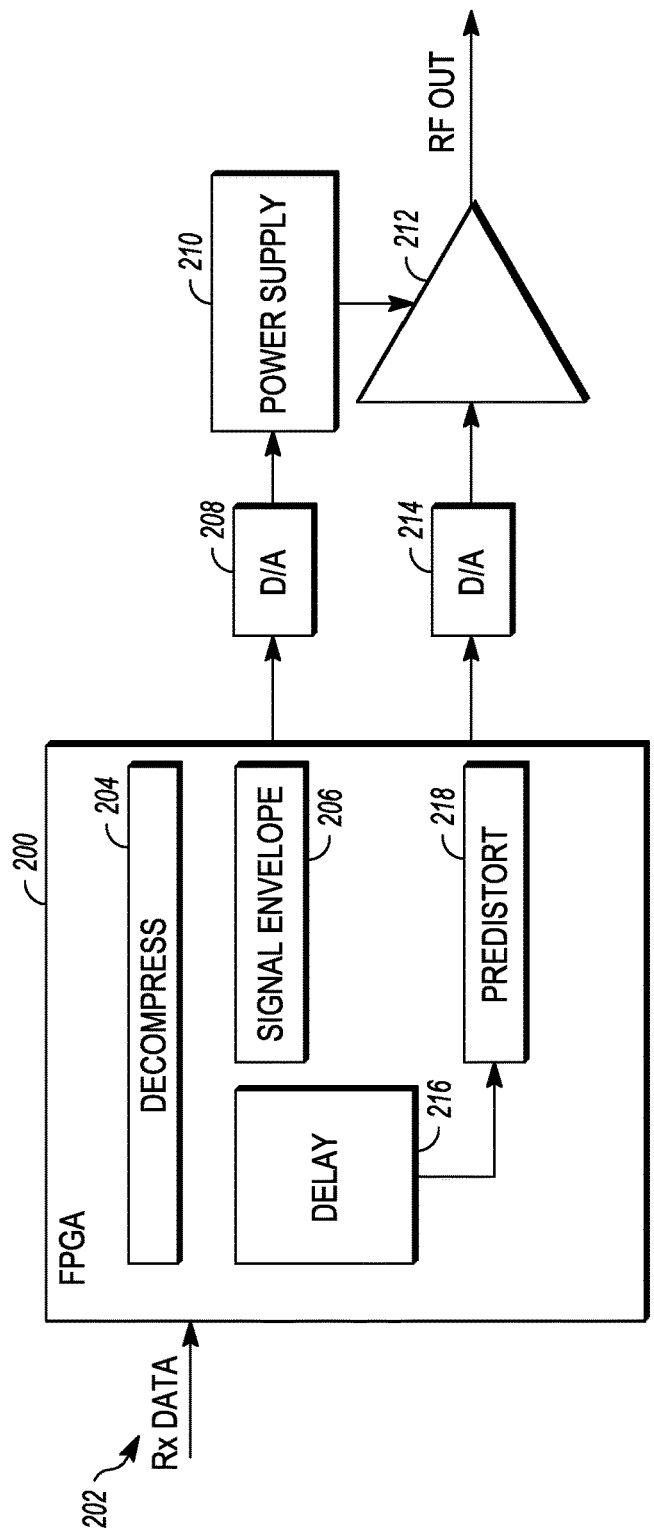
FIG. 16 schematically shows an envelope tracking power supply for an amplifier as described in the present disclosure.

The class AB amplifier described above benefits from reduced current consumption, but does require a supply voltage sufficient to reproduce output signals without driving the voltage at output FETs 140 and 142 in FIG. 8 negative. Thus, the amplifier shown in FIG. 8 generally lacks an efficiency benefit relating to required supply voltage. Power efficiency could be further increased in embodiments where a dynamic voltage supply is desired. The supply voltage as shown in FIG. 8 may therefore be modulated with an envelope tracking scheme to improve overall power efficiency. FIG. 16 schematically shows such an envelope tracking scheme.

FIG. 16 shows a field-programmable gate array (FPGA) 200 that receives data 202 from a transmitter (not shown). Typically, the data 202 may be compressed, in which case the FPGA 200 may decompress 204 the data and use it to generate a signal envelope 206, which may be fed to a D/A converter 208 used to bias a power supply 210 of amplifier 212. The FPGA 200 also uses the data 202 to drive a D/A converter 214 as an input to the amplifier 212, after delaying 216 and pre-distorting 218 the input signal to the amplifier 212. The pre-distortion of the signal is preferably applied so as to cancel the distortion of the amplifier 212. Thus, the FPGA 200 may dynamically modulate the power supply 210 to the amplifier 212 to operate it at the lowest current necessary to avoid clipping of the delayed, pre-distorted, and amplified input signal.

Figure 17:
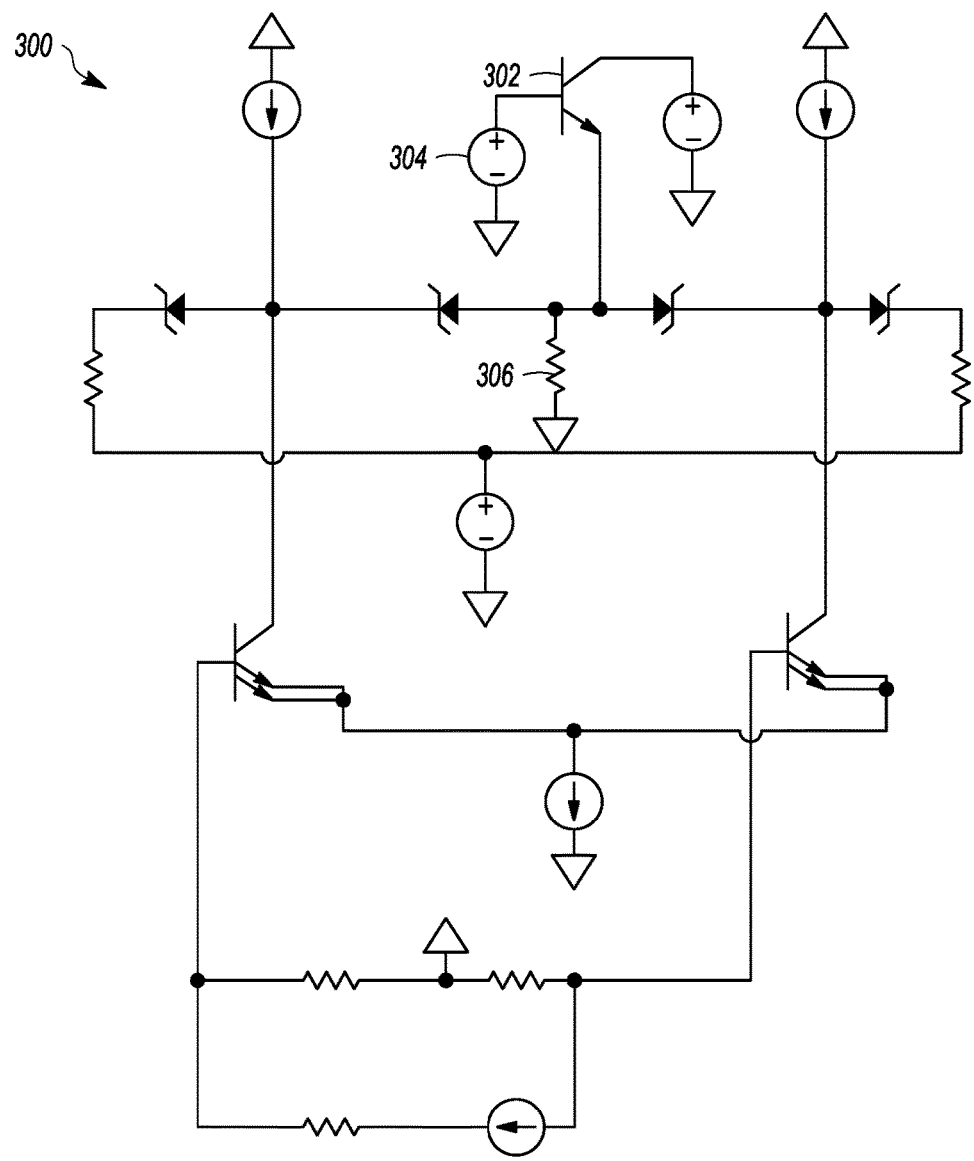
FIG. 17 shows a diode rectifier with summing output.
Figure 18:
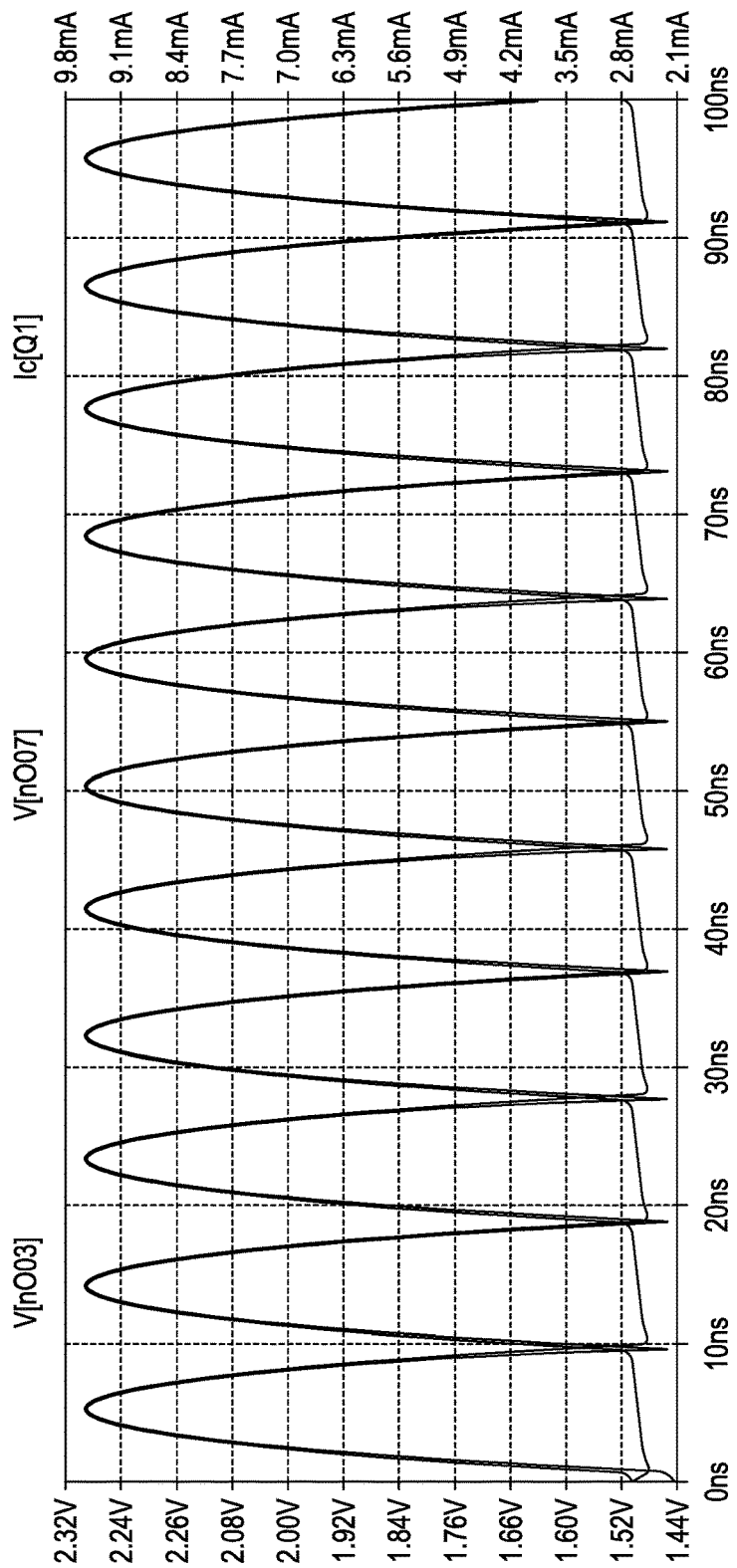
FIG. 18 shows the current in the collector of the transistor of FIG. 17.

Another approach to improve the efficiency of the power supply to a class AB amplifier may be to adopt "class AB" operation in the voltage supply of the amplifier. The output of the rectifier in FIG. 1 may also be summed and provided to a third output transistor, or the diodes 118b and 118c may be used for that purpose. FIG. 17, for example, generally shows a circuit 300, similar to that shown in FIG. 1, but adds a transistor 302 with a bias voltage 304 to the base of the transistor 302, a resistor 306 that sets a minimum bias on the transistor 302 and a supply 308 to the transistor 302. The current in the collector of transistor 302 is the sum of the rectifier outputs, as shown in FIG. 18. This means that the current in the collector is a measure of the signal amplitude that needs to be output and ideally this would be the supply voltage that is needed in the output stage of the amplifier.

By adding a further transistors this current signal can be converted to an output voltage that is modulated with peak values that exceed a provided supply voltage. Preferably this supply voltage exceeds the average required output voltage for the signal output stage.

Figure 19:
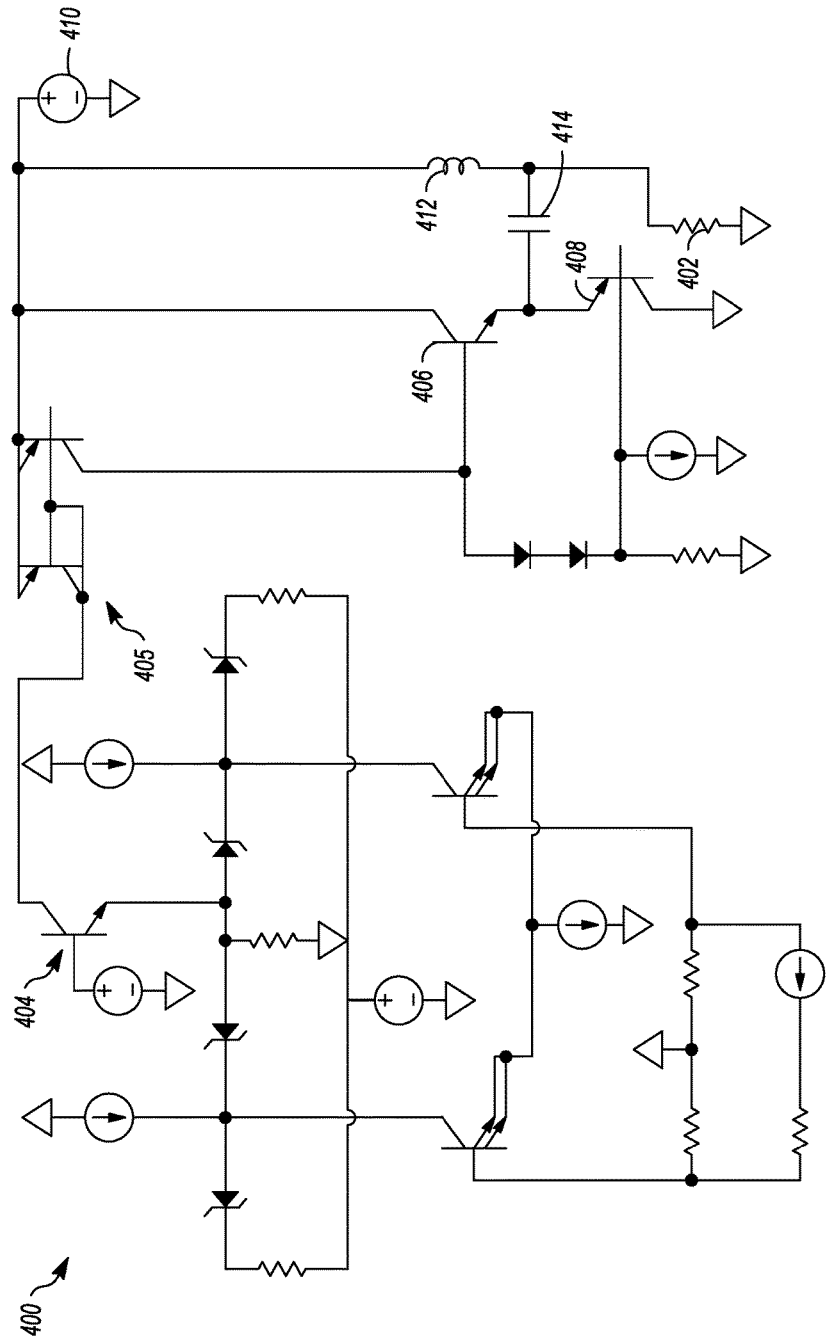
FIG. 19 shows an exemplary modulated voltage supply.

FIG. 19 schematically shows such a circuit 400 where the supply voltage exceeds the average required output voltage for the signal output stage. In this figure, which those of ordinary skill in the art will realize only provides a conceptual representation, it is assumed that a load such as resistor 402, or the signal output stage of an amplifier, needs a voltage supply that is modulated. The rectified signal from transistor 404 (same as 302) is provided to an amplifier, as shown in FIG. 18. In this embodiment, the PNP current mirror 405 and transistors 406 and 408 output the modulated waveform. This amplifier 400 may be biased from a low voltage bias source or a high voltage bias, in this case voltage 410. The output stage loading the circuit is represented by resistor 402 and needs an average bias voltage, in this case also represented by voltage 410 that is provided to the output stage via inductor 412. Inductor 412 passes the average voltage essentially without loss while representing a high impedance to high frequency signals. The high frequency modulation of the bias source is coupled to the load via the high pass filter consisting of capacitor 414.

The output impedance of the amplifier coupled via capacitor 414 to the load is low and thus presents itself as a voltage source. Most of the current to the output is provided via inductor 412, but when signals peak the additional current required is provided via capacitor 414. For a sine wave signal as used here, the signal peak to rms ratio is 1.41 and the benefit is small. However for broadband multi-channel signals the peak to rms ratio is around 5, and therefore the amount of current provided via the amplifier can be relatively small compared to the current provided via inductor 412 and a reduction in power consumption can be obtained. Numerous alternate implementations of the amplifier can be built, with one or with multiple power supplies. Power steering diodes in the supply path may also be used, however given the high frequency signals the parasitic capacitance and the switching artifacts of such diodes may be excessive.

Figure 20A:
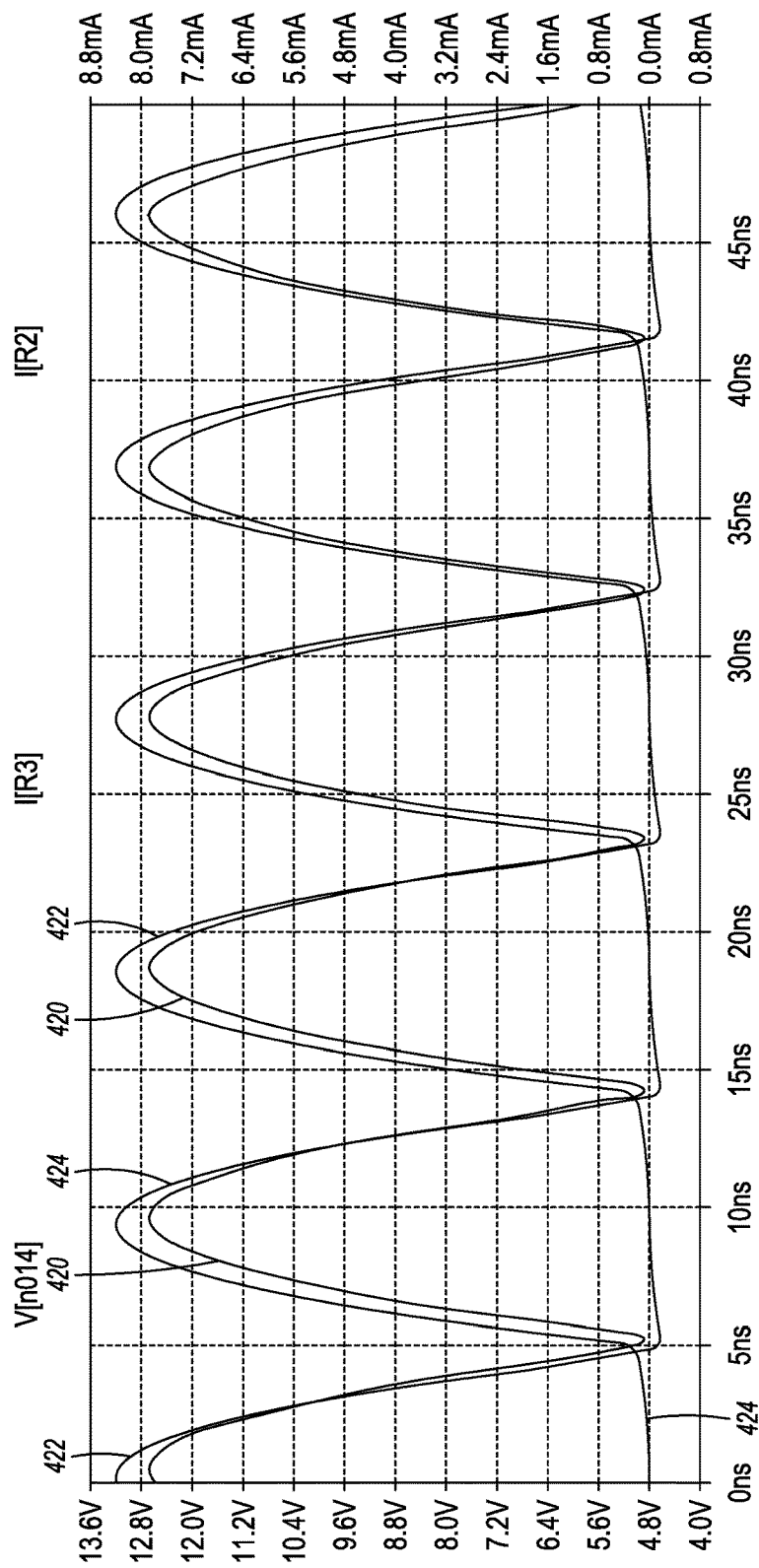
FIGS. 20A and 20B show the output of the voltage supply of FIG. 19.
Figure 20B:
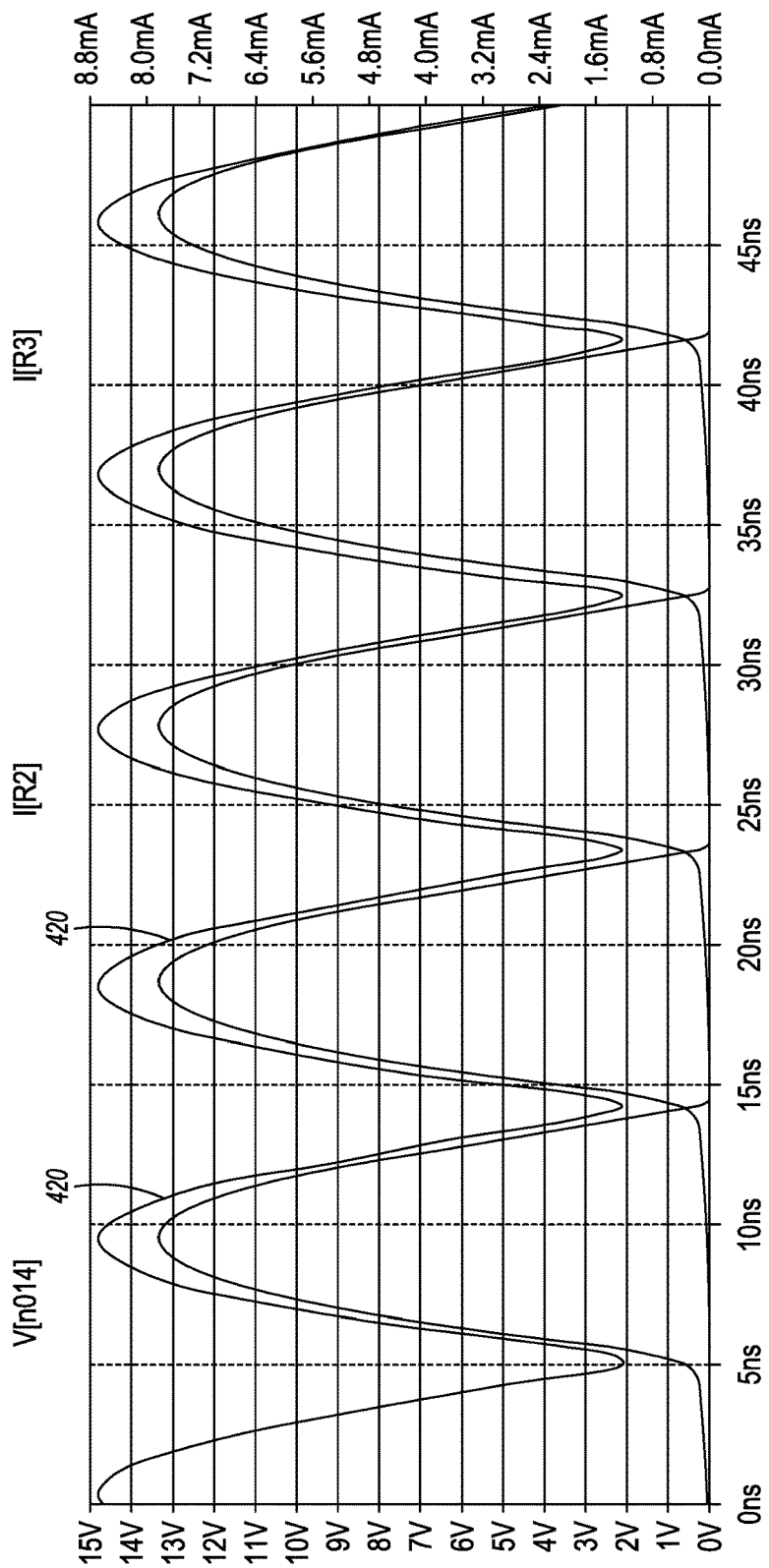

FIGS. 20A and 20B show an example output signal 420 of the modulated power supply overlapping the output currents of the rectifier in R2 and R3. If the amplifier in the voltage supply is built as an RF amplifier then the voltage can be modulated fast enough to obtain the equivalent of class AB operation in the supply voltage.

It should be noted that in general, the distorted voltage supply signal does not result in a distorted signal from an RF amplifier, including such a supply voltage, because the voltage supply signal is a common-mode signal to the output transformer that is self-cancelled in the magnetic coupling to the output winding. The transformer provides only the differential signal to the output. Therefore the linearity of the voltage supply amplifier may be poor without causing amplifier output signal distortion.

Figure 21:
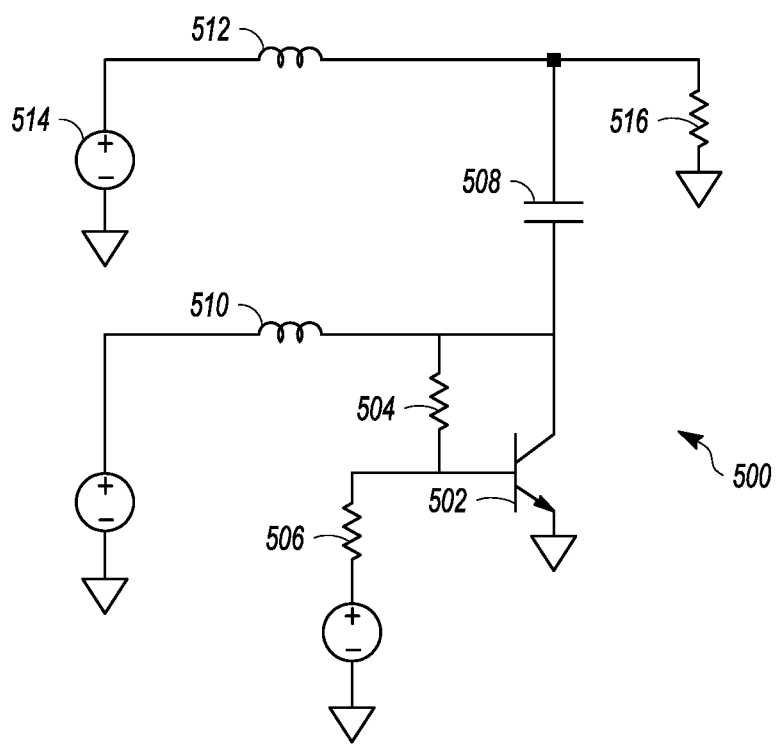
FIG. 21 shows a second embodiment of a modulated power supply.

FIG. 21 shows an alternate embodiment of a suitable power supply 500. Transistor 502, which could be a FET or a cascode structure, has a feedback resistor 504 and input resistor 506. The feedback is preferably chosen to be strong enough that the output impedance presented to capacitor 508 is low. The transistor 502 is biased at a high current, i.e. at least the peak current needed to be output through capacitor 508. Energy is stored in inductor 510. The voltage needed to maintain a high current in inductor 510 is given by resistive losses in inductor 501 and transistor 502, and is much lower than the main supply voltage 514. Main supply voltage 514 is provided to load 516 through inductor 512 such that the average voltage at load 516 is provided by the supply voltage 514. When a high signal pulse needs to be output, then the current in transistor 502 is reduced, and the current from inductor 510 is provided to the output via capacitor 508.

Figure 22:
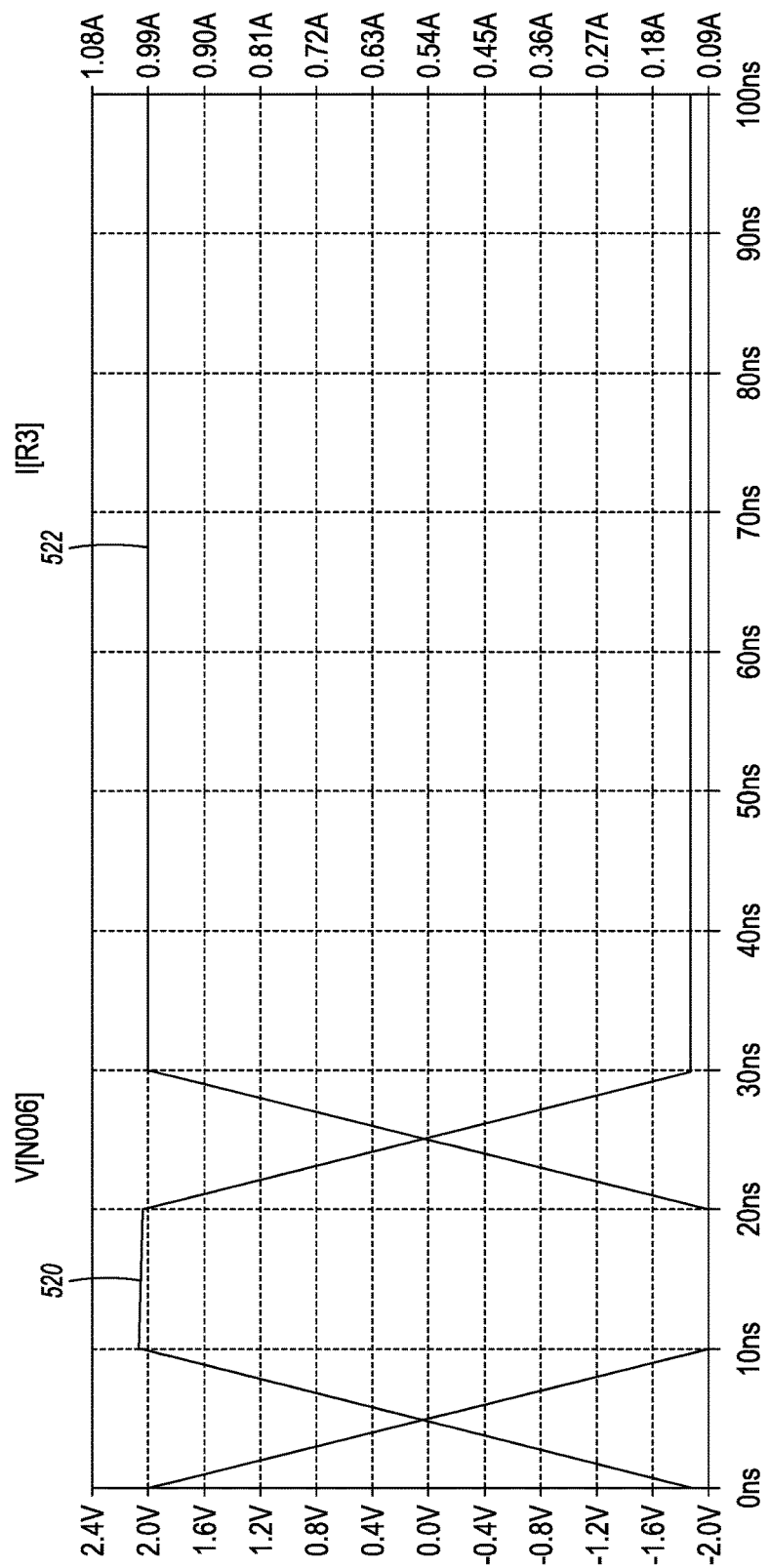
FIG. 22 shows pulsed output of the power supply of FIG. 21.

The average current in inductor 512 is approximately 100 mA from the supply voltage 514 of 12V; the average current in inductor 510 is approximately 1 A from the low voltage supply, thus each supply contributes around 1 Watt. The peak output voltage is 100 V with a current of 1 A so that the peak output power is around 100 Watts. FIG. 22 illustrates an example of pulsed output 520 from the input 522 provided using the modulated voltage supply of FIG. 21. Many other implementations may be considered, for instance inductors 510 and 512 may be coupled or transformers may be included.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. A class AB amplifier circuit comprising:
   an input capable of receiving an input signal that drives first and second transistors arranged in a differential pair, the transistors amplifying the input signal;
   an output for the amplified input signal from the first and second transistors the output comprising a first load and a second load;
   a steering network comprising a plurality of steering diodes, the steering network selectively directing a first phase of the input signal to the first load and a second phase of the input signal to the second load; and
   a cascode output stage receiving the amplified output signal from the first load and the second load.

2. The class AB amplifier circuit of claim 1 including feed-forward distortion compensation and/or cancellation.

3. The class AB amplifier circuit of claim 1 including a third transistor and a fourth transistor provided with the input signal and a signal representative of an amplifier output current so as to create an error signal used to cancel distortion in the output of the class AB amplifier circuit.

4. The class AB amplifier circuit of claim 3 where the third transistor and the fourth transistor operate in class A mode.

5. The class AB amplifier circuit of claim 1 including a variable power supply.

6. The class AB amplifier circuit of claim 5 where the variable power supply is modulated using a signal envelope based on the input signal.

7. The class AB amplifier circuit of claim 1 including an output transformer having a plurality of windings that produce a feedback signal used in a feedback distortion cancellation circuit.

* * * * *